United States Patent [19]

Barrett, Jr. et al.

[11] Patent Number: 5,770,980

[45] Date of Patent: Jun. 23, 1998

[54] FAST STARTING OSCILLATOR

[75] Inventors: Raymond Louis Barrett, Jr., Ft. Lauderdale; John Wayne Simmons, Tamarac; Barry Herold, Boca Raton; Grazyna A. Pajunen, Delray Beach, all of Fla.

[73] Assignee: Motorola, Inc., Schaumburg, Ill.

[21] Appl. No.: 773,244

[22] Filed: Dec. 23, 1996

[51] Int. Cl.$^6$ .............................. H03B 5/06; H03B 5/36
[52] U.S. Cl. ................................. 331/116 FE; 331/109; 331/159; 331/160; 331/183
[58] Field of Search .......................... 331/116 R, 116 FE, 331/109, 158, 159, 160, 183

[56] References Cited

U.S. PATENT DOCUMENTS 4,862,114  8/1989  Kleinberg ............................ 331/116 R
4,896,122  1/1990  Tahernia et al. ...................... 331/158
4,956,618  9/1990  Ulmer .................................. 331/116 FE Primary Examiner—Siegfried H. Grimm
Attorney, Agent, or Firm—John H. Moore

[57] ABSTRACT

A low power, fast starting oscillator (10) of the Colpitts type includes an amplifier (12) that provides voltage gain and feeds a source follower circuit (14) that provides a desirable output impedance. A crystal (16) is coupled from an output of the source follower circuit (14) back to the amplifier's input (32). The voltage gain of the amplifier (12) and the output impedance of the source follower circuit (14) are independently selectable to provide an optimum transconductance for the oscillator (10) to start quickly. When oscillations reach a threshold value, the transconductance may be reduced to save power.

19 Claims, 3 Drawing Sheets

5,770,980

FAST STARTING OSCILLATOR

FIELD OF THE INVENTION

This invention is directed to electronic oscillators of the type that provide signals of a predetermined frequency for clocking and other functions.

BACKGROUND OF THE INVENTION

Oscillators of the type discussed herein are typically constructed of transistor circuitry on an integrated circuit.

A discrete crystal is coupled to the transistor circuitry to maintain accurate control over the frequency of oscillations.

For oscillators that are used in battery powered equipment such as pagers, it is important to minimize the power consumed by the oscillator so as to increase the life of the battery. Conventional oscillators simply consume too much power for the extended battery life that equipment users now expect.

Another factor that influences oscillator design is the type of crystal that is used. Typically, the design and/or operating parameters of the oscillator circuitry is somewhat dependent on the particular design of the crystal that is used. Consequently, changing the crystal design necessitates making certain changes to the oscillator circuitry. It would be preferable to provide an oscillator circuit that is compatible with a variety of crystals, and that can operate over a relatively broad frequency range.

Another desirable attribute of a good oscillator is fast start-up time. Conventional oscillators use crystals that have a very high "Q" that prevents rapid changes of energy at resonance. Consequently, such oscillators require many cycles of adding small amounts of energy per cycle before the amplitude of oscillation grows to a level that is useful. It is desirable to provide an improved oscillator that has a faster start-up time, as well as consuming minimal power and being adaptable for use across a wide frequency range.

DESCRIPTION OF THE PREFERRED EMBODIMENT

Figure 1:
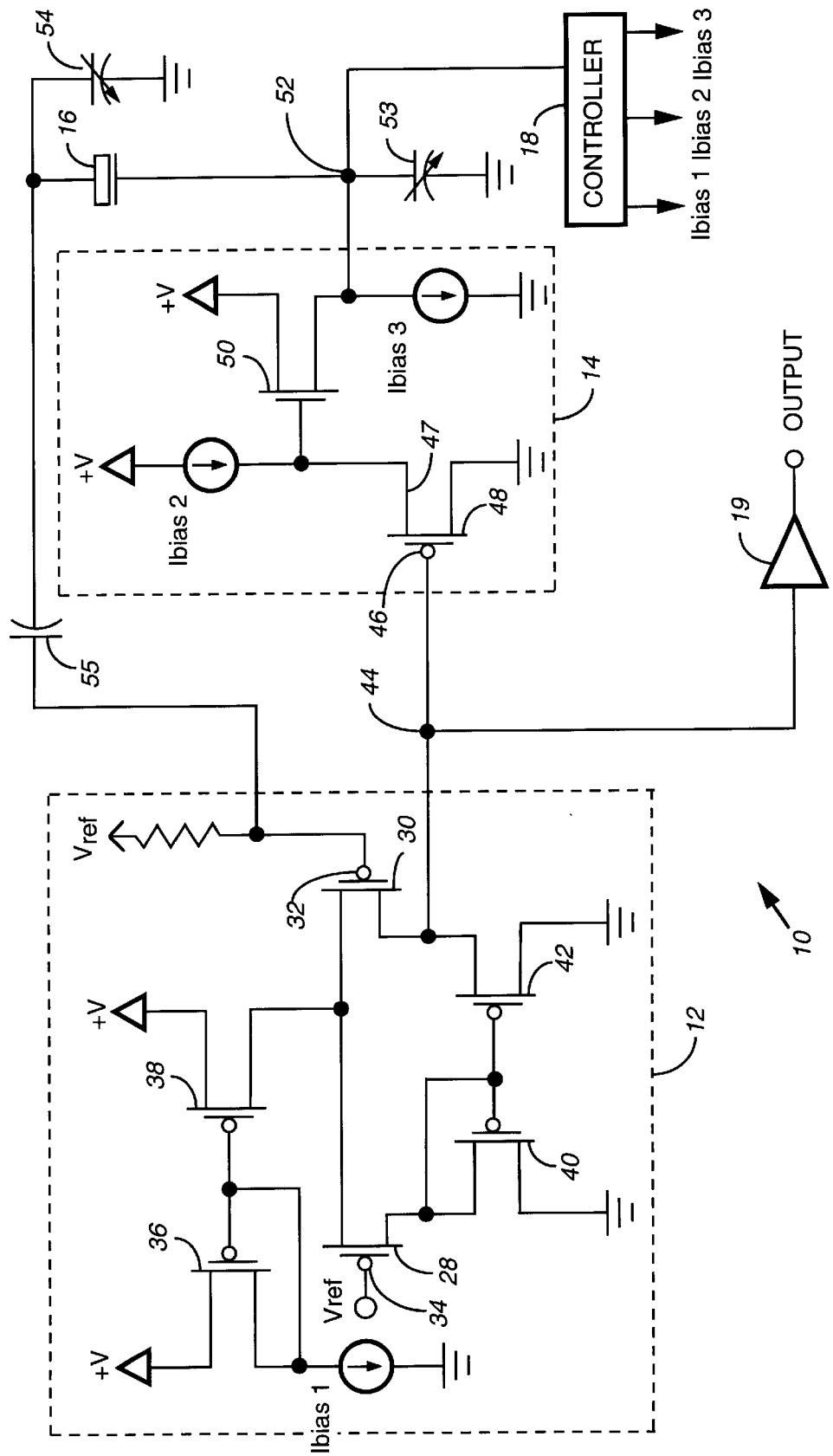
FIG. 1 is a schematic diagram of an oscillator which is constructed in accordance with the invention and which operates at relatively high frequencies.

Referring to FIG. 1, an oscillator 10 is shown that is constructed according to the invention. The illustrated oscillator is a Colpitts type oscillator that is implemented with MOS (Metal Oxide Semiconductor) technology. All the illustrated circuitry is preferably built on an integrated circuit, except for a small number of discrete components that are described later.

The illustrated oscillator 10 is designed to operate at a frequency of about 14 megahertz, but the same oscillator can operate at frequencies as low as 38 kilohertz if some minor modifications are made as discussed later.

The basic components of the oscillator 10 are an amplifier 12, a source follower circuit 14, and a discrete electro mechanical resonator, shown as a piezoelectric crystal 16. A controller 18 is preferably included in the illustrated high frequency version of the oscillator for conserving power. An output circuit comprising a conventional buffer 19 provides the oscillator's output signal.

Referring to the amplifier 12, it comprises a differential pair of transistors 28 and 30. The gates of transistors 28 and 30 are DC biased by a voltage Vref, with the gate 32 of transistor 30 at a relatively high AC impedance and the gate 34 of transistor 28 at a very low AC impedance.

A common mode bias current is established in transistors 28 and 30 by a current mirror comprised of transistors 36 and 38. The gates of transistors 36 and 38 are coupled together and to the drain of transistor 36 which carries a DC bias current Ibias 1. This bias current is generated by the controller 18 that is described later.

With the illustrated arrangement, the current Ibias 1 is also carried by transistor 38 to the sources of transistors 28 and 30 which each carry a DC bias current of one-half Ibias 1.

Another current mirror comprising transistors 40 and 42 provides a load for the differential pair of transistors 28, 30.

The amplifier 12 has an input at the gate 32 of transistor 30, and an output at node 44 (the drain of transistor 30). That output is DC coupled to the input 46 of the source follower circuit 14 which includes first and second transistors 48, 50. Each of the transistors 48, 50 is configured to operate as a source follower, with the output of transistor 48 being DC coupled to the input (gate) of transistor 50. The output of the source follower circuit 14, at node 52, is coupled to the crystal 16 which feeds oscillation signals back to the input (gate 32) of the amplifier 12 for amplification. Both sides of the crystal 16 are conventionally coupled to ground through capacitors 53 and 54 which are adjustable capacitors forming part of a conventional varactor circuit (not shown) for tuning the oscillator over a range of frequencies. A coupling capacitor 55 couples the crystal 16 to the input of the amplifier 12, thus completing the oscillator's feedback path.

The transistor 48 receives, at its source, a DC bias current Ibias 2. Similarly, the transistor 50 receives, at its source, a DC bias current Ibias 3. The currents Ibias 2 and I bias 3 are both generated by the controller 18.

The cascade arrangement of two source followers (transistors 48 and 50) provides a useful impedance transformation between the amplifier's output 44 and the output 52 of the source follower circuit 14. Relatively high voltage gain, a few tens of db (decibels), is achieved by the amplifier 12, with a gain reduction of a few db as the signal passes through the source follower circuit 14. Because of the very high bandwidth of the source follower circuit 14, it has a negligible effect on the overall gain and phase margin of the oscillator 10.

A feature of the source follower circuit 14 is that it DC couples the oscillator signal at the output 44 of the amplifier 12 to the output 52 of the source follower circuit 14. The advantage of such DC coupling is discussed below.

Another feature of the source follower circuit 14 is that it provides a low and selectable output impedance that contributes to an optimum gm (transconductance) for the combination of the amplifier 12 and the source follower circuit 14. The optimum gm permits the oscillator 10 to operate with a fast start time. How the optimum gm is obtained and controlled will now be explained.

It can be shown that, for a given design of a Colpitts type oscillator, there is an optimum gm that provides a fast start time for the oscillator; but operating with the optimum gm for a fast start time is not necessarily consistent with operating at minimum power consumption. The oscillator 10 is constructed to achieve a fast start time and still operate with very low power consumption by operating in two modes: a start mode in which the gm of the oscillator 10 is substantially optimized to provide a fast start time, and a run mode in which the gm of the oscillator 10 is reduced to conserve power while maintaining oscillations.

The gm of the oscillator 10 is substantially proportional to the oscillator's voltage gain divided by its output impedance. In the illustrated embodiment, the voltage gain of the oscillator 10 is provided by the amplifier 12, and the output impedance is determined by the output impedance of the source follower circuit 14. The oscillator's voltage gain and its output impedance are independently selectable, a desirable feature that permits the design to be optimized.

Figure 2:
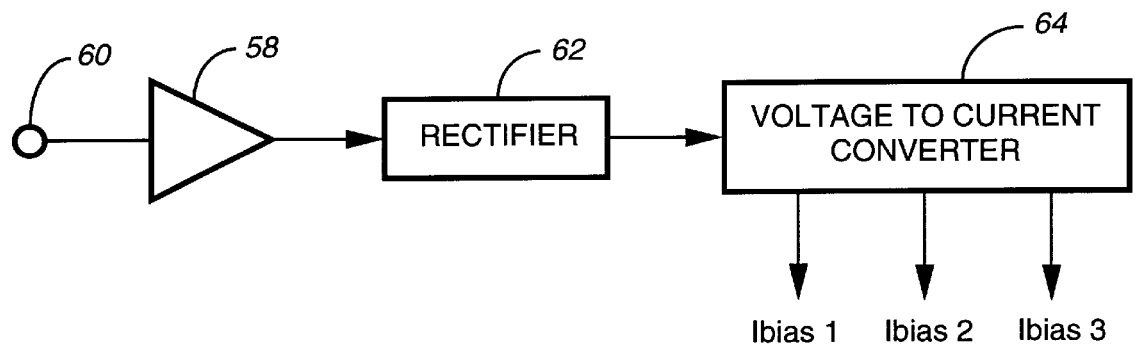
FIG. 2 shows more detail of the controller 18 shown in FIG. 1.

The gain of the amplifier 12 in proportional to its bias current which is substantially equal to Ibias 1. Thus, the gain of the amplifier 12 can be changed by changing the value of Ibias1. In the source follower circuit 14, its output impedance is proportional to Ibias 3, and, to a lesser extent Ibias 2. Accordingly, the output impedance of the source follower circuit 14 can be changed by changing the values of Ibias 2 and Ibias 3. All three of these bias currents are controlled by the controller 18 which is shown in more detail in FIG. 2.

The controller 18 includes a buffer 58 whose input 60 receives the oscillation signal that is present at node 52 (FIG. 1). The buffer 58 supplies the AC oscillation signal to a rectifier 62 which converts the AC oscillation signal to a DC voltage at the output of the rectifier 62. That DC voltage is received by a voltage to current converter 64 which provides Ibias1, Ibias2 and Ibias3 as outputs.

Figure 3:
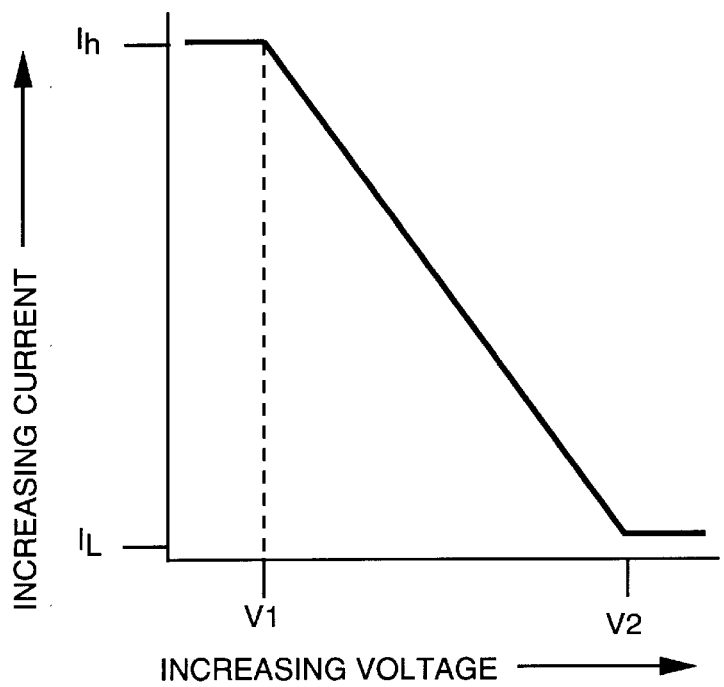
FIG. 3 is a graph that illustrates the transfer function for the voltage to current converter shown in FIG. 2.

The converter 64 is a conventional voltage to current converter that has the transfer function shown in FIG. 3. This transfer function shows how all three bias currents vary as a function of the amplitude of the DC voltage applied to the converter 64. The magnitudes of the three bias currents can be different from each other, but each bias current changes in the manner shown in FIG. 3.

Because the applied DC voltage is proportional to the magnitude of oscillation signals received by the controller 18, the bias currents vary as a function of the amplitude of the oscillation signal. At low levels of DC voltage (and correspondingly low amplitudes the oscillation signal), the bias currents are at a relatively high level Ih and remain high until the DC voltage increases to a threshold V1. Beyond the threshold, the bias currents gradually decrease until they reach a minimum value of IL, corresponding to a large input voltage V2.

When the oscillator 10 first starts up, the controller 18 supplies bias currents at a relatively high level. Thus, Ibias1 is at a high level, resulting in a relatively high gain in the amplifier 12. Consequently, the gm of the oscillator 10 is increased.

Ibias2 and Ibias3 are also at high levels during the start-up mode, resulting in a relatively low output impedance for the source follower circuit 14. This also raises the gm of the oscillator 10. The three bias currents are chosen such that, in the start-up mode, the gm of the oscillator 10 is substantially optimized for starting oscillations and bringing them to a useful amplitude as quickly as possible. A gm of approximately 28 millimhos was found to be optimum for a resonant frequency of 14.4 megahertz. This provided a start-up time of approximately 300 microseconds, whereas conventional oscillators typically have a start-up time of about 5 to 10 milliseconds.

The oscillator 10 draws about 300 microamps while operating in the start-up mode. As oscillations build in amplitude, they quickly reach a threshold value that corresponds to a DC voltage of V1 in FIG. 3. At this point, the controller 18 begins a gradual reduction of all three bias currents, thereby lowering the gm of the oscillator 10 by lowering the gain of the amplifier 12 and raising the output impedance of the source follower circuit 14.

When the amplitude of the oscillation signal increases to a level that corresponds to V2 in FIG. 3, it means that the oscillator signal's amplitude is at a desired working level, about 200 millivolts peak-to-peak for the illustrated embodiment, and the run mode begins. All three bias currents stop decreasing; they are maintained at their respective IL levels for the duration of the run mode. In the illustrated embodiment, the gm of the oscillator 10 is reduced to about 86 micromhos, and it draws as little as 50 microamps in the run mode. This is at least one order of magnitude lower than the power consumed by conventional oscillators.

It was noted above that a feature of the oscillator resides in the way the source follower circuit is DC coupled between the output of the amplifier 12 and the output node 52. As will now be explained, this feature allows the amplitude of the oscillator signal at node 44 to rise to a usefully high level, while limiting the amplitude of the oscillator signal at output node 52. Since the output node 52 is connected directly to the crystal 16, the amplitude of the oscillator signal at output node 52 should be limited. Signal amplitudes that are too large are detrimental, as they can negatively impact the long term accuracy and aging of the crystal.

Referring to transistor 48, it can be seen that the voltage level of a signal at its source 47 will be raised, relative to its gate 46, by the value of its gate-to-source voltage. Further, a signal at the source 47 of transistor 48 can only swing upward to the value of the supply voltage +V. Consequently, the amplitude of a signal at source 47 is limited. This limited amplitude signal is DC coupled through transistor 54 to the output node 52. This limiting of the amplitude of the oscillator signal protects the crystal 16 from the detrimental effects discussed above. In addition, a varactor circuit (not shown), which capacitors 53 and 54 are part of, receives only a low amplitude oscillation signal. Consequently, the varactor circuit can provide a wider tuning range than is possible with a relatively larger oscillation signal.

Another advantage of the illustrated DC coupling is that the DC level at node 44 is approximately the same as the DC level at the output node 52. This is due to the fact that the gate-to-source voltages of transistors 48 and 50 are approximately equal to each other and cancel each other's level shifting effect. Consequently, Vref can be selected to bias the transistors 28 and 30 in their optimum active region.

The oscillator 10 is fast starting, operates with very low power, and it can be used over a wide frequency range with only minor modifications. For example, to adapt the oscillator 10 to operate at a low frequency such as 38 kilohertz, the following changes are made: gate 32 of transistor 30 is DC coupled to node 52 (eliminating capacitor 55); and the controller 18 is eliminated, making Ibias1, Ibias2 and Ibias3 fixed bias currents. At low frequencies, the magnitudes of these bias currents need not be reduced after the oscillator starts producing a useful output. The current needed to quickly start oscillations is low enough, typically about 0.125 microamps, so that reduction is unnecessary.

Figure 4:
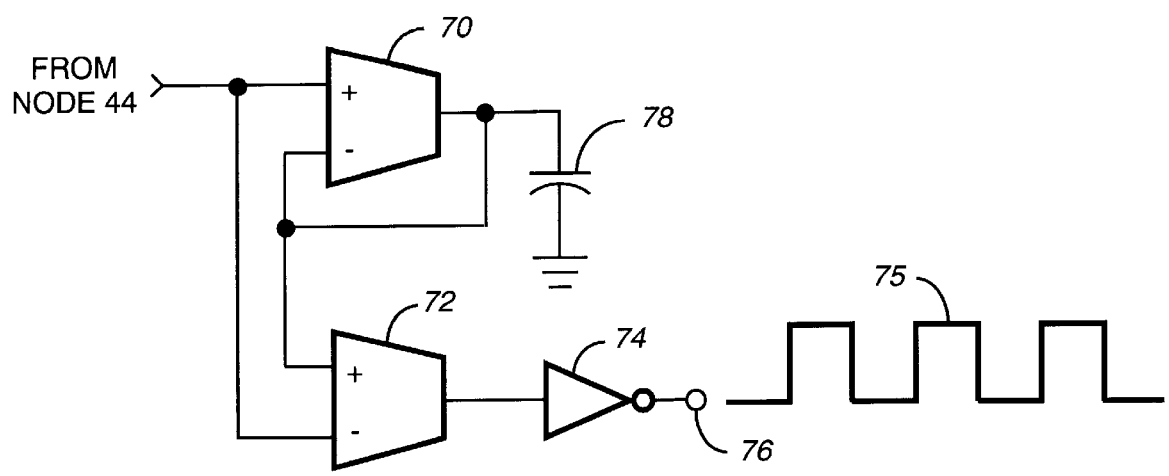
FIG. 4 is a schematic diagram of an output circuit for generating a digital output, particularly for relatively low frequency versions of the oscillator.

In some applications, particularly at relatively low frequencies, it is desirable to provide a digital or square wave output signal. This is preferably accomplished by applying the substantially sinusoidal oscillation signal at node 44 to the output circuit shown in FIG. 4 (eliminating the buffer 19 of FIG. 1). This output circuit includes amplifiers 70, 72 and an inverting buffer 74 for generating a square wave output signal 75 at an output terminal 76.

To generate the square wave, the signal at node 44 is coupled to the non-inverting input of amplifier 70 and the inverting input of amplifier 72. The amplifiers 70 and 72 are preferably matched operational transconductance amplifiers which may be of the same construction as the amplifier 12.

The inverting input of amplifier 70 is coupled to a filter capacitor 78 and to its own output. With this arrangement, the amplifier 70 and the capacitor 78 together form a low pass filter to generate, across capacitor 78, a DC voltage corresponding to the average value of the AC signal at node 44. That DC voltage is coupled as a bias voltage to the non-inverting input of the amplifier 72.

Consequently, amplifier 72 is optimally biased at the midpoint of its liner region to provide maximum gain for the oscillation signal received from node 44.

The output of amplifier 72 is coupled to the input of the inverting buffer 74 which provides additional amplification for developing the square wave signal 75 at the output terminal 76. A square wave suitable for clocks and other functions is developed at the output terminal 76 when amplifier 72 has a voltage gain of approximately 100, and a one millivolt oscillation signal is present at the node 44. (The steady state signal at node 44 is about 200 millivolts). With these conditions, a useful square wave is developed at the output terminal 76 in about 300 microseconds.

A factor that helps to quickly develop the square wave output is the design of the source follower circuit 14. It limits the amplitude of the oscillation signal at node 52 (FIG. 1), while the oscillation signal at node 44 is allowed to increase to a larger amplitude. This allows the signal at node 44 to quickly rise to a level sufficient to over drive amplifier 72, and thereby quickly provide a square wave output at output terminal 76.

Although the invention has been described in terms of a preferred embodiment, it will be obvious to those skilled in the art that many alterations and variations may be made without departing from the invention. Accordingly, it is intended that all such alterations and variations be considered as within the spirit and scope of the invention as defined by the appended claims.

What is claimed is:

1. A fast starting oscillator, comprising:
    an amplifier having an input, an output, and a voltage gain;
    a source follower circuit having an input, an output and an output impedance that is selectable substantially independently of the gain of the amplifier, the output of the amplifier being coupled to the input of the source follower circuit; and
    an electro-mechanical resonator tuned to resonate at a selected frequency and coupled between the input of the amplifier and the output of the source follower circuit,
    wherein the combination of the voltage gain of the amplifier and the output impedance of the source follower circuit is selected to provide fast start-up of oscillations at the selected frequency.

2. An oscillator as set forth in claim 1, wherein an oscillation signal having an amplitude is developed at the output of the amplifier, and wherein the source follower circuit receives the oscillation signal and limits its amplitude, thereby to provide to the electro-mechanical resonator an oscillation signal of limited maximum amplitude.

3. An oscillator as set forth in claim 1 wherein the output of the amplifier has a selected DC level, and wherein the output of the source follower circuit is at substantially the same selected DC level.

4. An oscillator as set forth in claim 3 wherein the source follower circuit is DC-coupled to the output of the amplifier, and wherein the source follower circuit includes first and second transistors that are DC-coupled to each other, with the first and second transistors each operating as a source follower.

5. An oscillator as set forth in claim 1 wherein the amplifier and the source follower circuit collectively have a transconductance that is substantially proportional to the gain of the amplifier and substantially inversely proportional to the output impedance of the source follower circuit, and further including a controller responsive to a threshold amplitude of oscillations for varying the transconductance.

6. An oscillator as set forth in claim 5 wherein the oscillator has a start-up mode followed by a run mode, and wherein the controller gradually changes the transconductance between the start-up mode and the run mode.

7. An oscillator as set forth in claim 1 wherein an oscillation signal is developed at the output of the amplifier, and further including:
    a low pass filter receiving the oscillation signal and developing a voltage corresponding to an average value of the oscillation signal; and
    a second amplifier having a first input receiving the oscillation signal, a second input receiving the voltage developed by the low pass filter, and an output at which an amplified oscillation signal is developed.

8. An oscillator as set forth in claim 7 wherein the low pass filter comprises:
    a capacitor; and
    a third amplifier substantially matching the second amplifier and having a first input receiving the oscillation signal, a second input and an output, the second input and the output being coupled to the capacitor and to the second input of the second amplifier.

9. An oscillator as set forth in claim 1 wherein the amplifier and the source follower circuit collectively have a transconductance that is substantially proportional to the voltage gain of the amplifier and substantially inversely proportional to the output impedance of the source follower circuit, wherein the oscillator has a start-up mode followed by a run mode, and wherein in the start-up mode the transconductance is substantially optimized for quickly starting oscillations, and in the run mode the transconductance is reduced to conserve power while maintaining oscillations.

10. An oscillator as set forth in claim 9, including a controller having an input receiving the oscillations and an output coupled to the amplifier, and wherein the controller varies the transconductance by varying the gain of the amplifier.

11. An oscillator as set forth in claim 10 wherein the amplifier carries a bias current and wherein the controller varies the gain of the amplifier by varying the bias current.

12. An oscillator as set forth in claim 11 wherein the controller supplies a relatively high level of bias current during the start-up mode, and the controller is responsive to a relatively high amplitude of oscillations for beginning a gradual reduction of the bias current.

13. An oscillator as set forth in claim 9, including a controller having an input receiving the oscillations and an output coupled to the source follower circuit, and wherein the controller varies the transconductance by varying the output impedance of the source follower circuit.

14. An oscillator as set forth in claim 13 wherein the source follower circuit carries a bias current and wherein the controller varies the output impedance of the source follower circuit by varying its bias current.

15. A fast starting oscillator, comprising:

an amplifier having an input, an output, and a voltage gain, the output being at a selected DC level and carrying an oscillation signal having an amplitude;

a source follower circuit having an output impedance that is selectable substantially independently of the voltage gain of the amplifier, and having an input that receives, from the amplifier, the oscillation signal and the selected DC level, the source follower circuit being adapted to limit the amplitude of the oscillation signal and to provide, at an output, an oscillation signal having a limited amplitude superimposed on a voltage that is substantially equal to the selected DC level; and an electro-mechanical resonator tuned to resonate at a selected frequency and coupled between the input of the amplifier and the output of the source follower circuit, wherein the combination of the voltage gain of the amplifier and the output impedance of the source follower circuit is selected to provide fast start-up of oscillations at the selected frequency.

16. An oscillator as set forth in claim 15 wherein the amplifier and the source follower circuit collectively have a transconductance that is substantially proportional to the gain of the amplifier and substantially inversely proportional to the output impedance of the source follower circuit, wherein the oscillator has a start-up mode followed by a run mode, and wherein in the start-up mode the transconductance is substantially optimized for quickly starting oscillations, and in the run mode the transconductance is reduced to conserve power while maintaining oscillations.

17. An oscillator as set forth in claim 16, including a controller having an input receiving the oscillations and an output coupled to the amplifier and to the source follower circuit, and wherein the controller varies the transconductance by varying the gain of the amplifier and the output impedance of the source follower circuit.

18. A fast starting oscillator, comprising:

an amplifier having an input, an output, and a variable gain, the output being at a selected DC level and carrying an oscillation signal having an amplitude;

a source follower circuit having first and second transistors each operating as a source follower, the first transistor having an input that is DC-coupled to the output of the amplifier, and the second transistor having an input that is DC-coupled to an output of the first transistor, the source follower circuit: having an output impedance that is variable, being adapted to limit the amplitude of the oscillation signal and to provide, at an output of the second transistor, an oscillation signal having a limited amplitude superimposed on a voltage that is substantially equal to the selected DC level;

an electro-mechanical resonator tuned to resonate at a selected frequency and coupled between the input of the amplifier and the output of the source follower; and a controller coupled to the amplifier and to the source follower circuit and responsive to the output of the amplifier for setting the gain of the amplifier and the output impedance of the source follower circuit so as to provide fast start-up of oscillations at the selected frequency.

19. An oscillator as set forth in claim 18 wherein the oscillator has a start-up mode followed by a run mode, and wherein the controller gradually reduces the gain of the amplifier and the output impedance of the source follower circuit between the start-up mode and the run mode.

* * * * *